United States Patent [19]
Lee et al.

[11] Patent Number: 5,883,911
[45] Date of Patent: Mar. 16, 1999

[54] SURFACE-EMITTING LASER DEVICE

[75] Inventors: Bun Lee; Jong-Hyeob Baek; Sung-Woo Choi, all of Daejeon; Jin-Hong Lee, Seoul, all of Rep. of Korea

[73] Assignee: Electronics and Telecommunications Research Institute, Daejeon, Rep. of Korea

[21] Appl. No.: 742,160

[22] Filed: Nov. 1, 1996

[30] Foreign Application Priority Data

Dec. 20, 1995 [KR] Rep. of Korea ................ 1995 52636

[51] Int. Cl.⁶ .................................................... H01S 3/19
[52] U.S. Cl. ................................................. 372/45; 372/96
[58] Field of Search ................................ 372/44, 45, 46, 372/96, 99

[56] References Cited

U.S. PATENT DOCUMENTS 5,289,494  2/1994  Tada et al. ........................... 372/96

OTHER PUBLICATIONS

Double–fused 1.52-$\mu$m vertical–cavity lasers; Dubravko I. Babic, James J. Dudley, Klaus Streubel, Richard P. Mirin, John E. Bowers, and Evelyn L. Hu; Received 19 Oct. 1994; accepted for publication 28 Dec. 1994; pp. 1030–1032.

Fabry–Perot reflectance modulator for 1.3$\mu$m from (InAlGa)As materials grown at low temperature; I.J. Fritz, B.E. Hammons, A.J. Howard, T.M. Brennen and J.A. Olsen; Received 10 Aug. 1992; accepted for publication 7 Dec. 1992; pp. 919–921.

High–Reflectivity $In_{0.29}Ga_{0.72}As/In_{0.28}Al_{0.72}As$ Ternary Mirrors for 1.3 $\mu$m Vertical–Cavity Surface–Emitting Lasers Grown on GaAs; Koji Otsubo, Hajime Shoji, Takuya Fujii, Manabu Matsuda and Hiroshi Ishikawa; Received Nov. 25, 1994; accepted for publication Jan. 10, 1995; pp. 227–229.

Epitaxial surface–emitting laser on a lattice–mismatched substrate; P.L. Gourley, I.J. Fritz, M. Brennen, B.E. Hammons and A.E. McDonald; Received 10 Oct. 1991; accepted for publication 14 Feb. 1992; pp. 2057–2059.

*Primary Examiner*—James W. Davie
*Attorney, Agent, or Firm*—Antonelli, Terry, Stout & Kraus, LLP

[57] ABSTRACT

An improved surface-emitting laser device by which the light emitting wave length can be easily varied since the electric potential grown using the thin film material having a desired lattice rate uses a very small portion of activation layers, and by which the continuous oscillation is made at room temperature by using the reflector having high reflective index. Thus, optical characteristics are increased, which includes a GaAs substrate; a lower reflector is formed of multiple layers of AlAs/GaAs heterogenous thin films having a reflective index of 1 on the GaAs substrate; a tooth-shaped grading layer is formed of a lower reflector on the lower reflector and an $In_xGa_{1-x}As$ thin film having a large lattice rate in a compositional grading method; a tooth-shaped InGaAs grading well is formed on the $In_xGa_{1-x}As$ grading layer as an In composition of which reduced rather than the grading layer; a buffer layer is formed on the $In_xGa_{1-x}As$ thin film and formed of a lattice-bonded InP; and an upper semiconductor reflector is formed on a multilayer of an InAlAs/InAlGaAs heterogenous thin film on the buffer layer, which has a reflective index of 1, in which a laser beam is emitted from the surface of the same.

4 Claims, 3 Drawing Sheets

SURFACE-EMITTING LASER DEVICE

BACKGROUND OF THE INVENTION

1. Field of the Invention

The present invention relates to a surface-emitting laser device, and more particularly to an improved surface-emitting laser device by which a continuous oscillation can be made at room temperature by junction-growing an AlAs/GaAs lower portion reflector having a high reflective index and an InAlAs/InGaAs upper portion reflector having a high lattice mismatch.

2. Description of the Conventional Art

The thin film material of a 1.5 micron laser device is directed to forming an InP substrate and depositing an InGaAs/InGaAsP mutilayer thin film of an InP group on the InP substrate. Recently, an InGaAs/InAlGaAs thin film growth method was performed in the industry. The basic construction of the surface-emitting laser device includes a lower reflector formed on the substrate, an activation layer, and an upper reflector.

In one reflector, the reflective index should be 1 at 1.5 micron, and in another reflector, the same should exceed 0.95.

As the reflector, the distributed Bragg reflector using the refractive difference of the ultralattice thin film structure has the best quality.

However, since the semiconductor reflector of the InP group has a small reflective index difference at 1.5 micron band, an optical wavelength band, the thin film thickness of the reflector having the reflective index of 1 is very thick.

The surface-emitting laser device having a thick reflector has a high resistance characteristic, and a high heat generation rate, and degrades the quantum efficiency.

Meanwhile, since the AlAs/GaAs thin film reflector of a GaAs group has a high reflective index and is thin, it is adaptable to 1.5 micron, however when the activation layer of the InP group is grown thereon, since the lattice mismatch is 4.2%, the optical characteristic of the activation layer is degraded.

As another junction method, there is a method for bonding the lower reflector of the GaAs group with the activation layer of the InP group at a high temperature. However, a characteristic degradation appears due to the high temperature process.

The Si/SiO$_2$ which is a dielectric material, or an AlGaSb/AlSb ultralattice reflector of the antimony both have a high refractive index, so it is possible to get a high reflective index at the thin layer.

However, the dielectric thin film has a low heat transfer rate, so it is difficult to practically use it in the industry. In addition, the antimony group is a new material, however more studies are necessary.

The surface-emitting laser device of 1.5 micron band width is one of ideal optical devices in the optical fiber communication, and the cost is not high.

In addition, parallel type optical communication using two dimensional arrays is capable of processing a large amount of information, so it becomes a major technique for the optical logic device and can be adapted for an optical digital computer.

The commercial use of this device can be substituted for the use of the expensive cross-section-emitting laser, and with its low cost, it may be used for home-based optical communication.

The laser device which is fabricated in the lattice structure requires a technique for developing a new thin film material and bonding heterogenous structures which have a different lattice constant since the laser device has a low reflective index characteristic.

However, in the industry, a more economic surface-emitting laser device which continuously oscillates at room temperature has not been introduced.

SUMMARY OF THE INVENTION

Accordingly, it is an object of the present invention to provide an improved surface-emitting laser device which overcomes the problems encountered in the conventional surface-emitting laser device.

It is another object of the present invention to provide a surface-emitting laser device by which the light emitting wave length can be easily varied since the electric potential grown using the thin film material having a desired lattice mismatch uses a very small portion of activation layers, and by which the continuous oscillation is made at room temperature by using the reflector having high reflective index, thus increasing optical characteristics.

To achieve the above objects, in accordance with one aspect of the present invention, there is provided a surface-emitting laser device, which includes a GaAs substrate; a lower reflector formed of a multiple layers of AlAs/GaAs heterogenous thin films having a reflective index of 1 on the GaAs substrate; a tooth-shaped grading layer formed of a lower reflector on the lower reflector and an In$_x$Ga$_{1-x}$As thin film having a large lattice mismatch in a compositional grading method; a tooth-shaped InGaAs grading well formed on the In$_x$Ga$_{1-x}$As grading layer as an In composition of which reduced rather than the grading layer; a buffer layer formed on the In$_x$Ga$_{1-x}$As thin film and formed of a lattice-bonded InP; and an upper semiconductor reflector formed of multiple layers of an InAlAs/InAlGaAs heterogenous thin film on the buffer layer, which has a reflective index of 1, in which a laser beam is emitted from the surface of the same.

To achieve the above objects, in accordance with another aspect of the present invention, there is provided a surface-emitting laser device, which includes a GaAs substrate; a lower reflector formed of multiple layers of AlAs/GaAs heterogenous thin films having a reflective index of 1 on the GaAs substrate;

also included are a tooth-shaped grading layer formed of a lower reflector on the lower reflector and an In$_x$Ga$_{1-x}$As thin film having a large lattice mismatch in a compositional grading method so as to reduce an electrical potential density; a tooth-shaped InGaAs grading well formed on the In$_x$Ga$_{1-x}$As grading layer as an In composition of which reduced rather than the grading layer; a buffer layer formed on the In$_x$Ga$_{1-x}$As thin film and formed of a lattice-bonded InP; a multilayer quantum well, on which multiple layers of an InGaAs/InAlGaAs thin film is laminated, formed on the InP buffer layer; and an upper semiconductor reflector formed of a multiple layers of an InAlAs/InAlGaAs heterogenous thin film on the quantum well, which has a reflective index which is slightly smaller than 1, in which a laser beam is emitted from the surface of the same.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
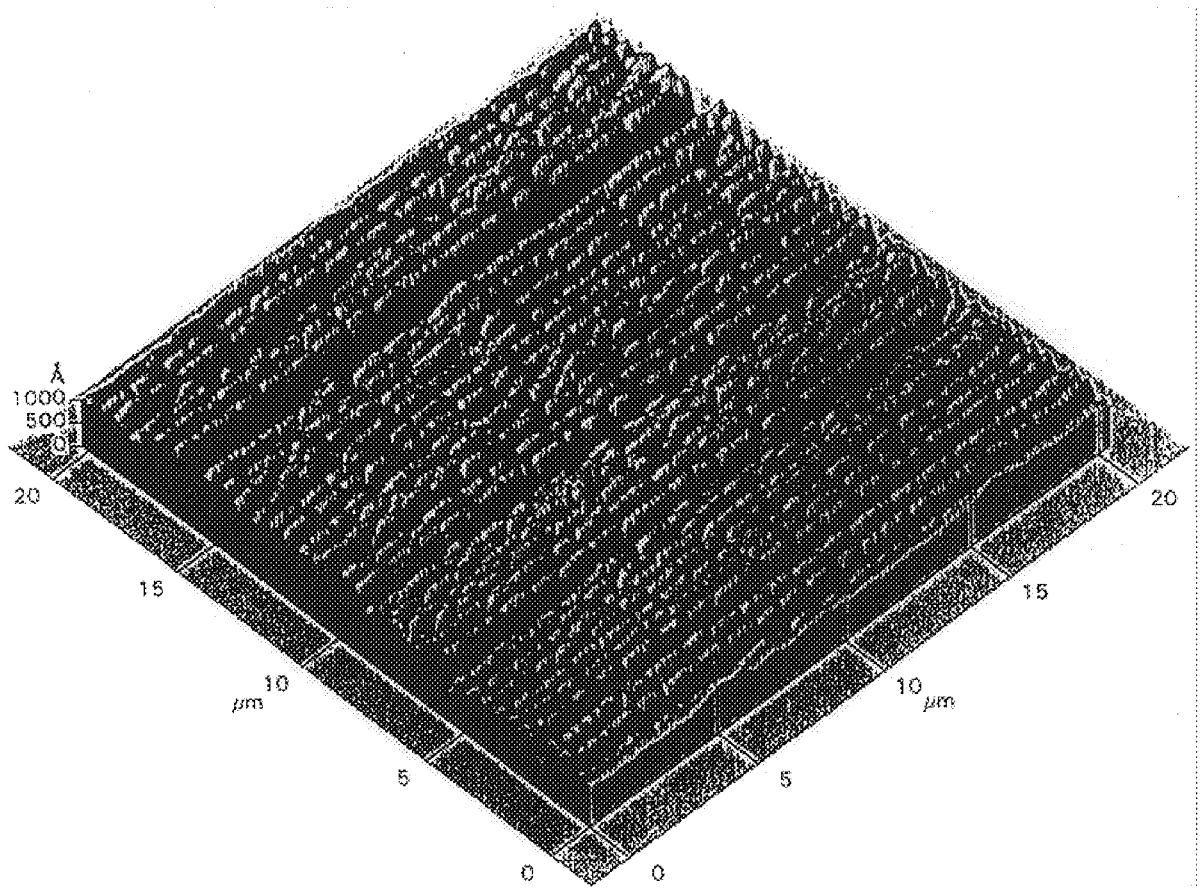
FIG. 1 is a surface view showing a GaAs substrate on which an InGaAs activation layer of 1.5 micron optical wavelength band is formed according to the present invention.
Figure 2:
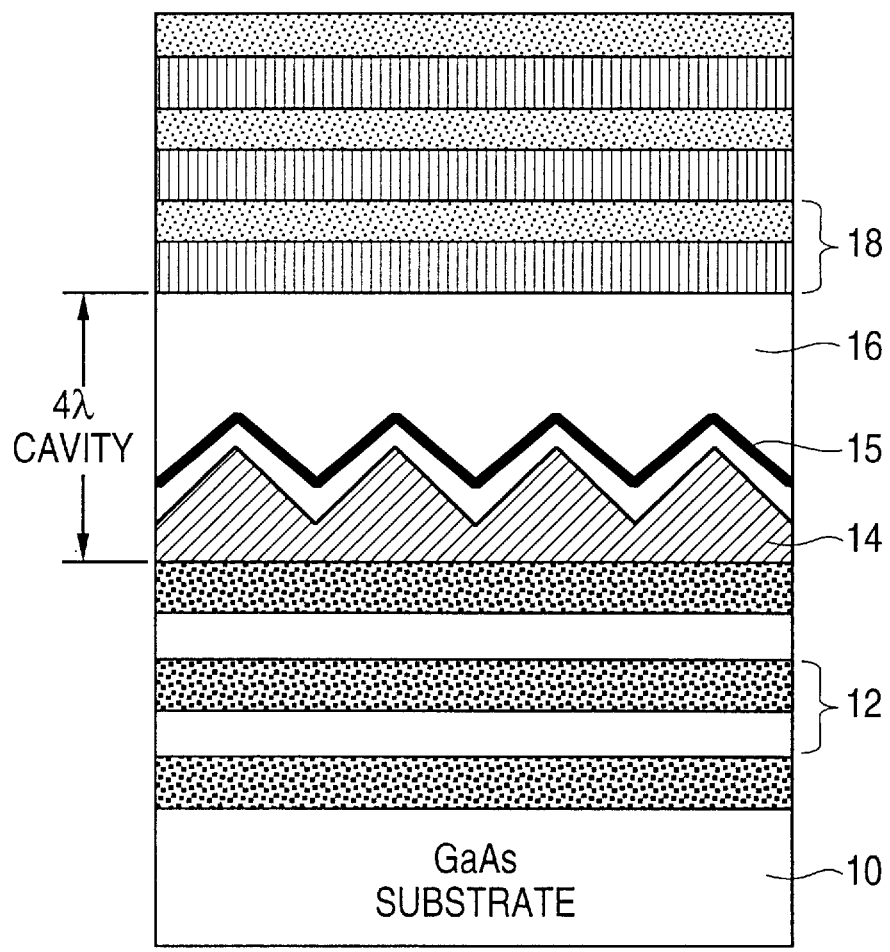
FIG. 2 is a cross-sectional view showing a surface-emitting laser device having a grading well structure according to one aspect of the present invention.
Figure 3:
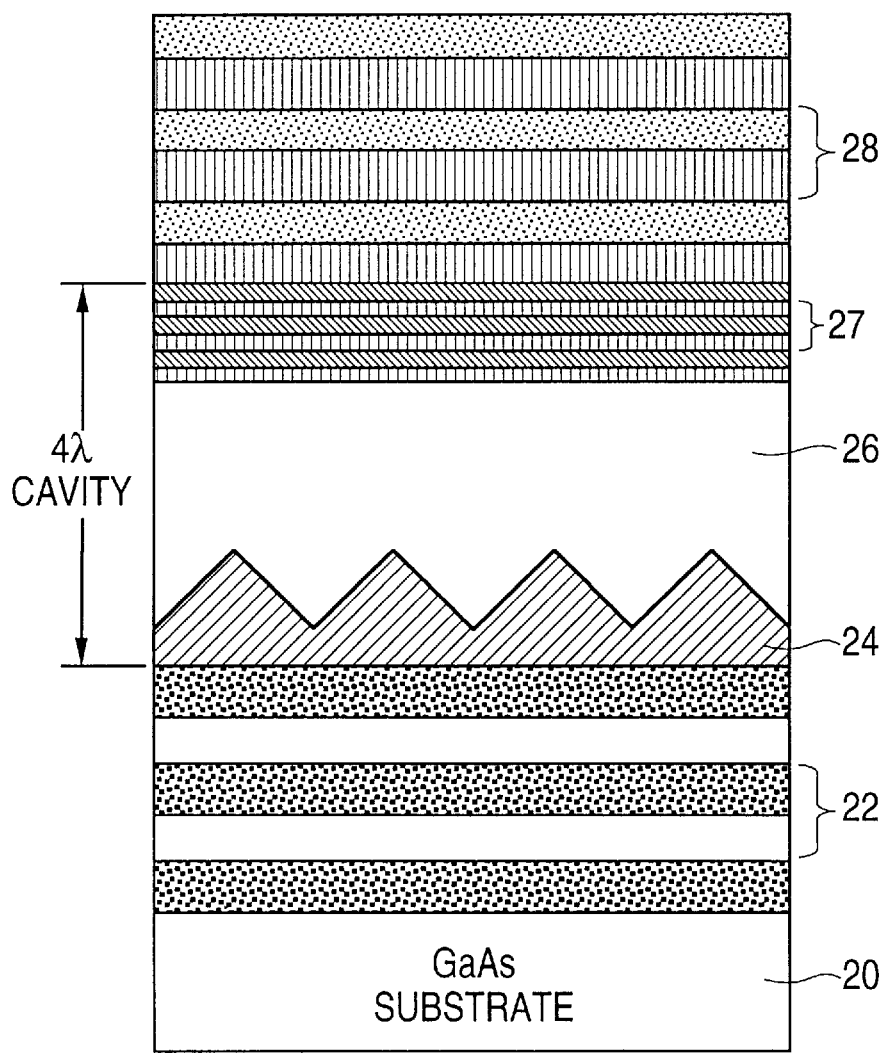
FIG. 3 is a cross-sectional view showing a surface-emitting laser device which is fabricated using an activation layer having a quantum well structure according to another aspect of the present invention.

FIG. 1 shows a view taken after an InGaAs activation layer having a 1.5 micron optical wavelength band is formed on a GaAs substrate. The detailed construction of the same is shown in FIGS. 2 and 3.

As shown in FIG. 1, it appears that peaks and valleys are arranged in one line, respectively, and a thin film structure deposited at the hill portion of the mountains is even and has very excellent optical characteristics.

As the growth method, the metalorganic chemical vapor deposition (MOCVD) method was used, and the shape of the mountains, the distance between the mountains, and the height of the same were adjusted by adjusting the growth condition.

A stripe-shaped pattern in FIG. 1 is a cross hatch pattern which is usually shown on the surface of the lattice type thin film.

In the thin film structure having a periodically appearing stripe-shaped pattern, the residual stress due to the lattice can be easily removed by forming a certain groove. so the physical characteristics are excellent.

As shown therein, in the thin film structure, the InGaAs grading layer in which the In composition is contained from 0 to 0.53 is deposited on the substrate in the compositional grading method, and an InGaAs cap layer in which the In composition is evenly contained is formed thereon.

A triangular quantum well structure is formed on the boundary portion between the grading layer and the cap layer.

This grading well structure is adaptable to the 1.5 micron optical wavelength band of the optical device since it has a high free-electron confinement.

The present invention is basically directed to adapting this activation layer to the surface-emitting laser device.

FIG. 2 shows the structure of the surface-emitting laser device having a grading well structure according one aspect of the present invention.

In the drawings, reference numeral 10 denotes a GaAs substrate.

A multilayer of an AlAs/GaAs lower reflector (DBR) 12 is formed on the GaAs substrate 10 to have a reflective index of 1. For example, about 20.5 pairs of the same are deposited thereon.

An $In_xGa_{1-x}As$ having large lattice characteristics is formed thereon, and an InP buffer layer 16 is formed thereon to have a mirror-like surface.

Here, a thin film in which the In composition (x) is gradually increased from 0 to 0.53 is formed in the compositional grading method which is used when forming the activation layer 14. The thin film has a thickness of 700 nm and a tooth-shaped structure.

In addition, the $In_{0.53}Ga_{0.47}As$ thin film 15 is formed between the tooth-shaped grading activation layer 14 and the InP buffer layer 16 by slightly reducing the In composition to have a thickness of 300 nm, and then a grading well is formed at the periphery where the grading portion is ended.

This grading well does not have any electrical potential and has excellent optical characteristics.

For example, about 20 pairs of the InAlAs/InAlGaAs upper reflectors 18 are formed on the buffer layer 16.

Here, the multilayer upper reflector 18 is formed to have a predetermined reflective index which is smaller than 1, and the InAlAs/InAlGaAs compound semiconductor is used so as to reduce the electrical potential density due to the lattice characteristic.

The laser beam is emitted from the upper surface of the same.

FIG. 3 shows the surface-emitting laser device which is fabricated using the activation layer having a quantum well structure according to another embodiment of the present invention.

A multilayer of the lower reflector (DBR) 22 in which the AlAs/GaAs is formed in order for the reflective index of the same to be 1 is formed on the GaAs substrate 20, and an activation layer 24 of the InP group having a large lattice characteristic is formed thereon.

The AlAs/GaAs lower reflector 22 has a high reflective index at a 1.5 micron optical wavelength band and an excellent heat transfer rate.

The activation layer 24 is grown on the lower reflector 22 to have a tooth-shaped structure having a thickness of 700 nm by gradually increasing the In composition from 0 to 0.53 in the compositional grading method so as to reduce the electrical potential density due to the lattice characteristic.

The thin film structure is the same as the first embodiment.

The InP buffer layer 26 is formed on the grading activation layer 24, and a mirror-like surface is obtained.

Here, the InP buffer layer 26 has no defects, and is a high purity thin film from which a residual stress is removed.

In this embodiment, the grading well is not formed at the boundary between the grading activation layer 24 and the InP buffer layer 26 due to the movement of As and P.

A quantum well 27 of a multilayer is formed on the inP buffer layer 26.

The quantum well 27 is formed as a multilayer quantum well structure formed of InGaAs/InAlGaAs, and is directed to increasing the electronic restriction force.

The thickness of the cavity of the activation region is 4□(□=1.5 um).

The device having the multilayer quantum well is directed to easily varying the optic wavelength energy.

A semiconductor reflector (DBR) 28 on which a multilayer InAlAs/InAlGaAs thin film is laminated is formed on the multilayer quantum well 27.

Of course, the laser beams emit from the upper surface thereof.

The present invention is directed to growing the lower reflector of the GaAs group, the activation layer of the InP group, and the upper reflector, thus achieving a 1.5 um surface-emitting laser device.

As described above, the present invention has the following advantages.

First, the optical characteristic is increased by using a reflector having a high reflective index, thus achieving a continuous oscillation at room temperature.

Second, the light emitting wavelength can be easily varied since the grown activation layer is used using the lattice characteristic.

Third, the fabrication process is simple, the fabrication rate is high, and the fabrication cost is low.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A surface-emitting laser device, comprising:

a GaAs substrate;

a lower reflector formed of multiple layers of AlAs/GaAs heterogenous thin films having a reflective index of 1 on the GaAs substrate;

a tooth-shaped $In_xGa_{1-x}As$ graded layer of on said lower reflector by a compositional grading method, having a large lattice mismatch with said lower reflector;

a tooth-shaped InGaAs grading well grown on the $In_xGa_{1-x}As$ grading layer as an In composition less than a final value of said graded layer;

a lattice matched InP buffer layer grown on the grading well; and an upper reflector formed of multiple layers of InAlAs/InAlGaAs heterogenous thin films on the buffer layer, which has a reflective index of 1, in which a laser beam is emitted from the surface of the same.

2. The device of claim 1, wherein said "x" of the compositional range of the In of the $In_xGa_{1-x}As$ grading layer is gradually graded from "0" to "0.53".

3. A surface-emitting laser device, comprising:

a GaAs substrate;

a lower reflector formed of multiple layers of AlAs/GaAs heterogenous thin films having a reflective index of 1 on the GaAs substrate;

a tooth-shaped $In_xGa_{1-x}As$ graded layer grown on said lower reflector by a compositional grading method, having a large lattice mismatch with said lower reflector;

a lattice matched InP buffer layer grown on the graded layer;

a buffer layer formed on the $In_xGa_{1-x}As$ thin film and formed of a lattice-bonded InP;

a multiple quantum well grown on said InP buffer layer and formed on an InGaAs/InAlGaAs thin film; and an upper reflector formed of multiple layers of an InAlAs/InAlGaAs heterogenous thin films on said quantum well, which has a reflective index which is slightly smaller than 1, in which a laser beam is emitted from the surface of the same.

4. The device of claim 3, wherein said "x" of the compositional range of the In of the $In_xGa_{1-x}As$ grading layer is gradually graded from "0" to "0.53".

* * * * *